April 22, 1958 E. McP. LEYTON 2,831,928

AMPLIFIER CIRCUIT FOR CORRECTING DISTORTION THEREIN

Filed Oct. 27, 1949

Inventor
ERIC McPHAIL LEYTON
By Ralph E. Atherton
Attorney

United States Patent Office 2,831,928

Patented Apr. 22, 1958

2,831,928

AMPLIFIER CIRCUIT FOR CORRECTING DISTORTION THEREIN

Eric McPhail Leyton, Wimbledon, London, England, assignor to Electric & Musical Industries Limited, Hayes, England, a company of Great Britain Application October 27, 1949, Serial No. 123,831

Claims priority, application Great Britain November 4, 1948

2 Claims. (Cl. 179—171)

This invention relates to electrical amplifying circuits comprising an electron discharge tube which is arranged to operate so that grid current flows during a part of the applied oscillations.

In such a circuit, as the mean amplitude of the applied oscillations varies the mean grid current in general varies in such a way that the input resistance of the tube also varies. This variation may affect the frequency response of the circuit, and is particularly disturbing in circuits intended to operate over a wide range of frequencies. The invention relates in particular but not exclusively to R. F. amplifiers such as are used for example in television transmitters wherein a carrier wave is modulated at a relatively low signal level. In such cases the modulated carrier wave requires to be amplified and in the process of such amplification distortion arises due to the above-mentioned flow of grid current. In effect, changes in the mean grid current cause a change in the resistance presented by the grid circuit to the coupling circuit feeding the oscillations to the tube, this resistance falling off as the amplitude of the oscillations increases, and causing the coupling circuit to possess a different frequency response for different amplitudes. The object of the invention is to provide means whereby the input impedance of the circuit may be made less variable as the amplitude of the oscillations varies.

According to the invention there is provided an electrical amplifying circuit arrangement for amplifying amplitude modulated oscillations comprising an electron discharge tube having at least an output electrode, a control electrode and a cathode, a source of amplitude modulated oscillations, a tuned input circuit for applying said oscillations between said control electrode and cathode with an amplitude to cause said control electrode to take current and produce a damping effect in said input circuit, means for generating a bias for said tube varying automatically with the instantaneous value of the modulation and having an amplitude sufficient to reduce substantially variations in said damping effect due to the modulation and to leave said oscillations modulated in amplitude, and an output circuit connected to said output electrode, said tube feeding said amplitude modulated oscillations unlimited to said output circuit.

Figure 1:
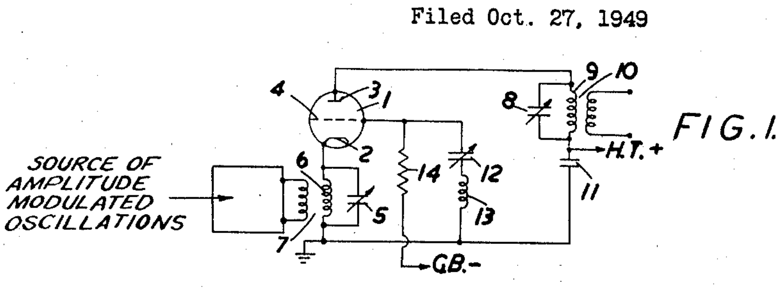
Figure 2:
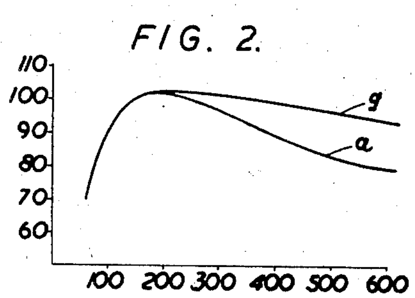
Figure 3:
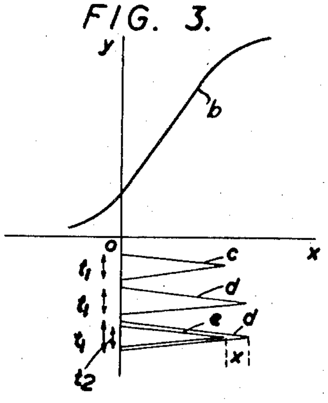
Figure 4:
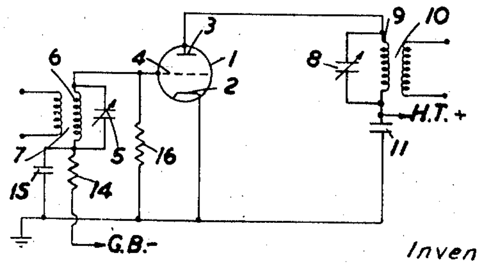

In order that the said invention may be clearly understood and readily carried into effect, the same will now be more fully described with reference to the accompanying drawings, in which:

Figure 1 is a circuit diagram illustrating the invention as applied to a cathode-driven amplifier for amplifying radio-frequency oscillations and which may be for example the output amplifier of a television transmitter, Figures 2 and 3 are diagrams for explaining the operation of the circuit of Figure 1, and Figure 4 is a circuit diagram showing a grid-driven amplifier.

Referring to Figure 1, the circuit comprises an electron discharge tube 1 having a cathode 2, and anode 3, and a control grid electrode 4. Oscillations to be amplified are fed to cathode 2 via a parallel resonant input circuit comprising a variable capacitor 5 and an inductance 6 which constitutes the secondary winding of an input transformer 7. The anode load includes a parallel resonant output circuit comprising a variable capacitor 8 and an inductance 9 which constitutes the primary winding of an output transformer 10. H. T. voltage is applied to anode 3 via inductance 9, and a blocking capacitor 11 is provided between inductance 9 and ground. Between control electrode 4 and ground is provided a series resonant circuit, comprising a variable capacitor 12 and an inductance 13, which serves to maintain control electrode 4 at ground potential for alternating currents of the frequency of the oscillations to be amplified, namely the frequency of the carrier wave and its sideband components. Control electrode 4 is connected to a source of negative bias which serves to bias said electrode to cut-off. It will be observed that the negative bias is fed to the control electrode via a resistor 14. During the occurrence of oscillations which are not of sufficiently high amplitude to draw grid current, the bias on the control electrode remains substantially constant. Upon the occurrence of oscillations of larger amplitude, grid current flows, and in the absence of the resistor 14 the resistance presented to the applied oscillations would vary appreciably with the amplitude of the oscillations. Curve *a* of Figure 2 shows the relation between the mean input voltage plotted as abscissae and input resistance plotted as ordinate for a typical amplifying discharge tube and it will be seen that as the amplitude of the applied oscillations increases the input resistance decreases. Due to the provision of resistor 14, however, the input resistance can be maintained more nearly constant, since as the amplitude of the oscillations increases the voltage drop across resistor 14 increases, thereby increasing the negative voltage on control electrode 4, tube 1 thereby being biassed below cut-off to an extent dependent on the amplitude of the input signals, which is of course dependent upon the modulation. The operation may be regarded as a movement of the whole wave-form of the applied oscillations in the negative direction of the tube characteristic. This is illustrated in Figure 3, where curve *b* represents the anode current versus input voltage characteristic of a typical amplifying tube, and curves *c* and *d* represent consecutive oscillations applied to the control electrode of tube 1. It may be assumed, for example, that the oscillations comprise a carrier wave modulated by television signals, point O representing black and the abscissae OX representing modulation in the direction of white. The oscillation represented by curve *d* is of greater amplitude than that represented by curve *c* and in the absence of the resistor 14 the variation of input resistance which would result due to the modulation frequency component of grid current would cause the amplifier to operate with a different frequency response. Due to the provision of resistor 14, however, and the consequent variation in modulation frequency component of the grid bias as the grid current varies, the waveform of curve *d* is in effect moved in the negative direction of the tube characteristic, as represented by curve *e* and to the extent represented by *x*. Accordingly, although the amplitude of oscillation has increased, the phase angle of conduction, that is to say the part of one cycle of oscillation over which grid current flows, is decreased from $t_1$ to $t_2$, and the value of the resistor 14 is selected so that the effective resistance presented to the applied oscillations is less variable. There is of course also a reduction of the amplitude of the oscillation *c* due to the voltage drop across the resistor 14, and although this reduction is less than the reduction *x* which is experienced by the oscillation *d*, since the flow of grid current responds to the modulation, nevertheless the bias variations caused by the flow of the modulation frequency component of grid current in the resistor 14 does not remove the amplitude modulation, but is merely sufficient to reduce substantially variations in the effective resistance presented to the applied oscillations by the control electrode-to-cathode circuit of the valve.

Considering the whole circuit, there are two paths presented to the cathode current. One path is via the anode 3 and has a substantially constant impedance $$\frac{K}{g}$$

where K, is a factor depending on the angle of flow of anode current and $g$ is the mutual conductance of the tube, and the other path is represented by the control electrode circuit. The impedance $$\frac{K}{g}$$

is employed to provide the major part of the load terminating the coupling circuit 5 and 6 that drives the tube 1. The resistance due to the control electrode circuit completes the terminating load and is maintained sensibly constant by means of the invention, although in the absence of the invention it would vary appreciably. Referring again to Figure 2 curve (*g*) as compared with curve (*a*) shows the improvement. Curve *a* was obtained in the absence of the invention, and curve (*g*) when a series resistor of 70 ohms was employed as resistor 14. Such a value of resistor is suitable for use with a tube known as ACT 26 made by the M. O. Valve Company Limited and operated as a class B cathode-driven amplifier with an anode voltage of 3,000 volts a grid bias of −30 volts and an anode load of 550 ohms. It will be evident that the 70 ohms resistor 14 is too small to remove the amplitude modulation of the applied oscillations and thus limit said oscillations since the voltage drop produced across a resistor of this magnitude is insufficient to change the control electrode bias to such an extent as to maintain constant the maximum potential difference between the control electrode and cathode. The present invention is therefore distinguished from a class C amplifier in which bias for the control electrode is produced by the voltage drop across a resistor connected in series with the control electrode-to-cathode circuit. Such an amplifier is used to amplify unmodulated carrier frequency oscillations and the magnitude of the biassing resistor is such that the change of bias produced tends to maintain constant the maximum potential difference between the control electrode and cathode. Moreover, with such an amplifier the amplification of only a single frequency is involved and the problem of variations of the frequency response due to variations of the effective resistance presented to applied oscillations by the control electrode-to-cathode circuit of an amplifier valve is only significant for the amplification of amplitude oscillations covering a wide band of frequencies. It is also evident that the voltage drop across the 70 ohm resistor 14 and the consequent bias produced is responsive to the instantaneous value of the modulation since the resistor 14 is not by-passed for modulation frequencies but only for signals of the frequencies of the applied oscillations, namely the frequencies of the carrier wave and its sideband components, which of course are much higher than the modulating frequencies. This distinguishes from the bias variations used for producing gain control in automatic gain control circuit for in such circuits it is essential that the bias variations are responsive to the average amplitude of applied oscillations and not the instantaneous value of the modulation.

By suitably selecting the negative grid bias voltage and the value of resistor 14, it is possible to reduce the variation of input resistance of the amplifier from 30 percent to 1 percent over a wide range of oscillation amplitudes as shown in Figure 2. Said range may be increased by employing a resistor 14 having a non-linear resistance characteristic.

The invention has so far been described with reference to a cathode-driven amplifier since such amplifier has certain advantages. Firstly, the control electrode serves to screen the cathode and anode circuits from one another. Secondly, the power losses are less than in the case of grid-driven amplifiers, since in the latter case it is necessary to provide a separate terminating resistor in place of the terminating impedance afforded by the cathode impedance $$\frac{K}{g}$$

which is presented in the case of the cathode-driven amplifier of Figure 1. As a result the termination introduces heating losses whereas in the cathode driven amplifier the energy that would otherwise be wasted in the termination reappears usefully in the anode circuit of the driven valve. However, the invention is not limited to cathode-driven amplifiers and the advantage of improved frequency response can be obtained in the case of grid-driven amplifiers.

Figure 4 shows a circuit incorporating a grid-driven amplifier. Elements corresponding to elements of the circuit of Figure 1 have been given the same reference numerals. In this case the modulated R. F. oscillations are applied to the control electrode of tube 1, and a condenser 15 connects one end of the circuit 5, 6 to ground for R. F. voltage. The resistor 14 is connected to the control electrode 4 via the inductance 6, and the above-mentioned terminating impedance is constituted by a resistor 16 of suitable value.

It is to be understood that the invention can also be applied to circuits which include tubes arranged to operate as cathode followers.

It is further to be understood that whilst in the circuits described the variable grid bias is derived from the voltage variations in a resistor in which the grid current flows, the invention includes circuits wherein the variable grid bias is derived by rectification of the applied signals.

What I claim is:

1. A circuit arrangement for amplifying amplitude modulated oscillations, comprising an electron discharge tube having at least an output electrode, a control electrode and a cathode, a source of amplitude modulated oscillations, a tuned input circuit for applying said oscillations between said control electrode and cathode with an amplitude to cause said control electrode to take current and produce a damping effect in said input circuit, means for generating a bias for said tube varying automatically with the instantaneous value of the modulation and having an amplitude sufficient to reduce substantially variations in said damping effect due to the modulation and to leave said oscillations modulated in amplitude, and an output circuit connected to said output electrode, said tube feeding said amplitude modulated oscillations unlimited to said output circuit.

2. A circuit arrangement for amplifying amplitude modulated oscillations comprising an electron discharge tube having at least an output electrode, a control electrode and a cathode, a source of amplitude modulated oscillations, a tuned input circuit for applying said oscillations between said control electrode and cathode with an amplitude to cause said control electrode to take current and produce a damping effect in said input circuit, a resistor connected in series with the control electrode-to-cathode path of said tube, means by-passing said resistor only for currents of higher frequencies than the modulation frequencies said resistor being dimensioned to generate a bias for said tube varying automatically with the instantaneous value of the modulation, and having an amplitude sufficient to reduce substantially variations in said damping effect due to the modulation and to leave said oscillations modulated in amplitude, and an output circuit connected to said output electrode, said tube feeding said amplitude modulation oscillations unlimited to said output circuit.

References Cited in the file of this patent

UNITED STATES PATENTS

| | | |
|---|---|---|
| 1,521,852 | Arnold | Jan. 6, 1925 |
| 1,869,331 | Ballantine | July 26, 1932 |
| 1,893,302 | Peterson | Jan. 3, 1933 |
| 2,266,167 | Conklin | Dec. 16, 1941 |
| 2,276,873 | Rambo et al. | Mar. 17, 1942 |

| | | |
|---|---|---|
| 2,395,615 | Curtis | Feb. 26, 1946 |
| 2,399,091 | Bingley et al. | Apr. 23, 1946 |
| 2,431,333 | Labin | Nov. 25, 1947 |
| 2,463,229 | Wheeler | Mar. 1, 1949 |
| 2,478,021 | Strutt et al. | Aug. 2, 1949 |
| 2,489,266 | Cawein | Nov. 29, 1949 |

FOREIGN PATENTS

| | | |
|---|---|---|
| 609,858 | Great Britain | Oct. 7, 1949 |

OTHER REFERENCES

Text—Radio Engineering by Terman—third edition—1947, McGraw-Hill Book Co., pages 381, 382, 383.